United States Patent
Xu et al.

(10) Patent No.: US 9,576,815 B2
(45) Date of Patent: Feb. 21, 2017

(54) GAS-PHASE SILICON NITRIDE SELECTIVE ETCH

(71) Applicant: Applied Materials, Inc., Santa Clara, CA (US)

(72) Inventors: Jingjing Xu, Cupertino, CA (US); Fei Wang, Fremont, CA (US); Anchuan Wang, San Jose, CA (US); Nitin K. Ingle, San Jose, CA (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/690,165

(22) Filed: Apr. 17, 2015

(65) Prior Publication Data

US 2016/0307771 A1   Oct. 20, 2016

(51) Int. Cl.
*H01L 21/302* (2006.01)
*H01L 21/311* (2006.01)

(52) U.S. Cl.
CPC .................. *H01L 21/31116* (2013.01)

(58) Field of Classification Search
CPC ................................................. H01L 21/31116
USPC .......... 216/72, 73, 74, 99, 79; 438/735, 254, 438/706, 689, 744, 737; 257/E21.219, E21.244, 257/E21.245, E21.268
See application file for complete search history.

(56) References Cited

U.S. PATENT DOCUMENTS

| | | | |
|---|---|---|---|
| 3,859,222 A | 1/1975 | Squillace et al. | |
| 4,793,897 A * | 12/1988 | Dunfield | C23F 4/00 204/192.37 |
| 4,956,314 A | 9/1990 | Tam et al. | |
| 5,022,961 A * | 6/1991 | Izumi | C04B 41/5346 134/3 |
| 5,472,562 A | 12/1995 | Ziger | |
| 6,132,631 A | 10/2000 | Nallan et al. | |
| 6,148,761 A * | 11/2000 | Majewski | C23C 16/45565 118/715 |
| 6,500,356 B2 | 12/2002 | Goto | |
| 8,148,270 B2 | 4/2012 | Tao | |
| 8,679,985 B2 * | 3/2014 | Nishimura | H01L 21/31116 216/58 |
| 2005/0142885 A1 * | 6/2005 | Shinriki | H01L 21/31116 438/706 |
| 2010/0173499 A1 | 7/2010 | Tao et al. | |
| 2010/0320548 A1 | 12/2010 | Tsau et al. | |

(Continued)

FOREIGN PATENT DOCUMENTS

WO    2013-088324 A3    6/2013

*Primary Examiner* — Nadine Norton
*Assistant Examiner* — Christopher Remavege
(74) *Attorney, Agent, or Firm* — Kilpatrick Townsend & Stockton LLP

(57) ABSTRACT

A method of etching silicon nitride on patterned heterogeneous structures is described and includes a gas phase etch using anhydrous vapor-phase HF. The HF may be combined with one or more of several precursors in the substrate processing region and near the substrate to increase the silicon nitride etch rate and/or the silicon nitride selectivity. The silicon nitride etch selectivity is increased most notably when compared with silicon of various forms. No precursors are excited in any plasma either outside or inside the substrate processing region according to embodiments. The HF may be flowed through one set of channels in a dual-channel showerhead while the other precursor is flowed through a second set of channels in the dual-channel showerhead.

16 Claims, 6 Drawing Sheets

(56) References Cited

U.S. PATENT DOCUMENTS

| | | | |
|---|---|---|---|
| 2011/0256645 A1* | 10/2011 | Tam | C23C 16/45519 438/14 |
| 2012/0238097 A1 | 9/2012 | Huang et al. | |
| 2012/0289056 A1 | 11/2012 | Bergman et al. | |
| 2014/0271097 A1* | 9/2014 | Wang | H01L 21/6708 414/805 |
| 2016/0020115 A1* | 1/2016 | Demichi | H01L 21/0206 438/735 |
| 2016/0260616 A1* | 9/2016 | Li | H01L 21/3065 |

* cited by examiner

GAS-PHASE SILICON NITRIDE SELECTIVE ETCH

FIELD

Embodiments described herein relate to selectively removing silicon nitride.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which removes one material faster than another helping e.g. a pattern transfer process proceed. Such an etch process is said to be selective to the first material. As a result of the diversity of materials, circuits and processes, etch processes have been developed with a selectivity towards a variety of materials. However, there are few options for selectively removing silicon nitride faster than silicon.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have also been developed to remove silicon nitride, however, the silicon nitride selectivity of these etch processes (relative to silicon) can still benefit from further improvements.

Methods are needed to improve silicon nitride etch selectivity relative to silicon for dry etch processes.

SUMMARY

A method of etching silicon nitride on patterned heterogeneous structures is described and includes a gas phase etch using anhydrous vapor-phase HF. The HF may be combined with one or more of several precursors in the substrate processing region and near the substrate to increase the silicon nitride etch rate and/or the silicon nitride selectivity. The silicon nitride etch selectivity is increased most notably when compared with silicon of various forms. No precursors are excited in any plasma either outside or inside the substrate processing region according to embodiments. The HF may be flowed through one set of channels in a dual-channel showerhead while the other precursor is flowed through a second set of channels in the dual-channel showerhead. The substrate temperature may be higher than room temperature HF processes which selectively remove silicon oxide instead of silicon nitride.

Embodiments described herein include methods of etching a patterned substrate. The methods include placing the patterned substrate in a substrate processing region of a substrate processing chamber. The patterned substrate has an exposed silicon nitride portion and an exposed secondary portion and the exposed secondary portion comprises a material other than silicon nitride. The methods further include flowing anhydrous hydrogen fluoride into the substrate processing region. The methods further include dry-etching the exposed silicon nitride portion, wherein the silicon nitride is removed at a silicon nitride etch rate which is greater than a secondary etch rate at which the exposed secondary portion is removed.

The exposed silicon nitride portion may consist of silicon and nitrogen. The exposed secondary portion may be silicon oxide. The exposed secondary portion may be one of single-crystal silicon, polysilicon or amorphous silicon. The methods may further include flowing an OH-group-containing precursor into the substrate processing region. The OH-group-containing precursor and the anhydrous hydrogen fluoride may first mix within the substrate processing region. The substrate processing region may be plasma-free during the operation of dry-etching the exposed silicon nitride portion. In some embodiments, the anhydrous hydrogen fluoride is not excited in any plasma prior to entering the substrate processing region. The methods may further include flowing a silicon-and-fluorine-containing precursor into the substrate processing region. The silicon-and-fluorine-containing precursor and the anhydrous hydrogen fluoride may first mix within the substrate processing region.

Embodiments described herein include methods of etching a patterned substrate. The methods include placing the patterned substrate in a substrate processing region of a substrate processing chamber. The patterned substrate has exposed silicon nitride and one of exposed silicon or exposed silicon oxide. The methods further include flowing HF vapor into a remote region fluidly coupled to the substrate processing region through a dual-channel showerhead. The HF vapor flows from the remote region to the substrate processing region through a first channel comprising through-holes through the dual-channel showerhead. The methods further include flowing a second precursor into the substrate processing region through a second channel comprising holes which open into the substrate processing region but not directly into the remote region. The methods further include combining the HF vapor with the second precursor in the substrate processing region. The methods further include etching the exposed silicon nitride more rapidly than the one of exposed silicon or exposed silicon oxide.

A selectivity of the operation (exposed silicon nitride:one of exposed silicon or exposed silicon oxide) may be greater than or about 75:1. In some embodiments, neither the HF vapor nor the second precursor flow through any plasma prior to entering the substrate processing region. The second precursor may include one or more of $H_2O$, $C_3H_8O$, $CH_3OH$, or $Si_xF_y$. A temperature of the patterned substrate may be between 40° C. and about 160° C. during the operation of etching the exposed silicon nitride.

Embodiments described herein include methods of etching a patterned substrate. The methods include placing the patterned substrate within a substrate processing region of a substrate processing chamber. The patterned substrate has an exposed silicon nitride portion and an exposed portion of silicon oxide. The methods further include flowing anhydrous HF into the substrate processing region. The methods further include flowing $Si_xF_y$ into the substrate processing region without first passing the $Si_xF_y$ through a plasma. The methods further include combining the anhydrous HF and the $Si_xF_y$ in the substrate processing region and etching the exposed silicon nitride portion. A temperature of the patterned substrate is between 50° C. and 80° C. The $Si_xF_y$ may be, for example, $SiF_4$.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the disclosed technology may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A method of etching silicon nitride on patterned heterogeneous structures is described and includes a gas phase etch using anhydrous vapor-phase HF. The HF may be combined with one or more of several precursors in the substrate processing region and near the substrate to increase the silicon nitride etch rate and/or the silicon nitride selectivity. The silicon nitride etch selectivity is increased most notably when compared with silicon of various forms. No precursors are excited in any plasma either outside or inside the substrate processing region according to embodiments. The HF may be flowed through one set of channels in a dual-channel showerhead while the other precursor is flowed through a second set of channels in the dual-channel showerhead. The substrate temperature may be higher than room temperature HF processes which selectively remove silicon oxide instead of silicon nitride.

Selective remote gas phase etch processes have used aggressive oxidizing precursors in combination with remotely excited fluorine-containing precursor to achieve etch selectivity of silicon nitride relative to silicon. Aggressive oxidizing precursors were used to oxidize a thin layer of the silicon to prevent further etching. The methods presented herein limit the aggressiveness of the oxidation and remove the remote plasma component which further enhances the effective etch selectivity. These advantages become increasingly desirable for decreased feature sizes.

Figure 1:
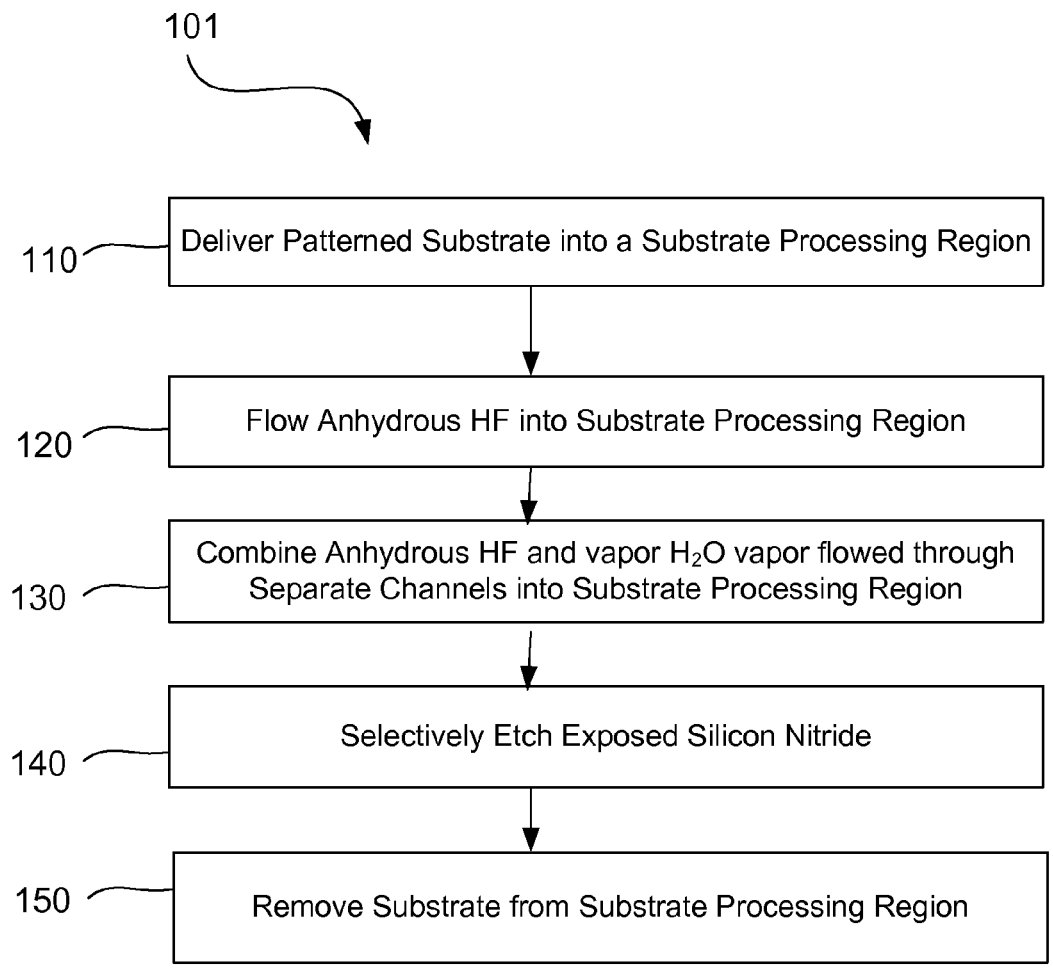
FIG. 1 shows a method of selectively etching silicon nitride according to embodiments.

To better understand and appreciate the embodiments, reference is now made to FIG. 1 which is a flow chart of a silicon nitride selective etch process 101 according to embodiments. Prior to the first operation, a structure is formed in a patterned substrate. The structure possesses exposed portions of silicon nitride and an exposed second portion formed from, e.g. silicon or silicon oxide. The substrate is then delivered into a substrate processing region in operation 110.

A flow of anhydrous hydrogen fluoride is initiated into the substrate processing region in operation 120. No plasma is ignited in the substrate processing region or upstream from the substrate processing region in embodiments. The substrate processing region may be referred to as a plasma-free substrate processing region during any or all operations described herein. The anhydrous hydrogen fluoride is combined with water vapor ($H_2O$) in the plasma-free substrate processing region in operation 130. The water vapor is not passed through any remote plasma before entering the substrate processing region according to embodiments. Similarly, the anhydrous hydrogen fluoride is not passed through any remote plasma before entering the substrate processing region in embodiments.

The patterned substrate is selectively etched (operation 140) such that the exposed silicon nitride is selectively removed at a higher rate than the exposed second portion. The exposed second portion may comprise or consist of silicon in embodiments. The exposed second portion may comprise or consist of silicon and oxygen according to embodiments. The addition of water vapor (or a second precursor as generalized later) is optional and may be used to increase the etch rate of silicon nitride and/or to increase the etch selectivity of silicon nitride relative to the exposed second portion. Process effluents and unreacted reactants are removed from the substrate processing region and then the substrate is removed from the processing region (operation 150).

Silicon nitride selective etch process 101 may be used to remove silicon nitride faster than silicon. Rather than oxidizing the exposed silicon to prevent etching, the precursor combinations described herein have been found to produce reactants which predominantly etch the silicon nitride and leave silicon essentially alone. As a consequence, essentially no silicon is consumed to produce a protective silicon oxide layer to achieve the high etch selectivities. Silicon oxide is also not etched using these chemistries and so portions of exposed silicon oxide are also present on the patterned substrate according to embodiments.

The etch processes introduced herein have been found to provide silicon nitride etch selectivity not only to high density silicon oxide films but also to low density silicon oxide films. The broad silicon nitride selectivity enables these gas phase etches to be used in a broader range of process sequences. Exemplary deposition techniques which result in low density silicon oxide include chemical vapor deposition using dichlorosilane as a deposition precursor, spin-on glass (SOG) or plasma-enhanced chemical vapor deposition. High density silicon oxide may be deposited as thermal oxide (exposing silicon to, e.g., $O_2$ at high temperature), disilane precursor furnace oxidation or high-density plasma chemical vapor deposition according to embodiments. The selectivity of etch process 101 (exposed silicon nitride:exposed high quality silicon oxide) may be greater than 75:1, greater than 90:1 or greater than 100:1 in embodiments. The selectivity of etch process 101 (exposed silicon nitride:exposed low quality silicon oxide) may be greater than 30:1, greater than 40:1 or greater than 50:1 according to embodiments.

Using the gas phase dry etch processes described herein, the etch selectivities have been increased compared to older techniques which rely on the formation of a protective thin silicon oxide layer over silicon portions. Selectivity will be defined herein by determining how far a silicon interface has moved so the protective silicon oxide layer is considered "etched" silicon. These etch process parameters apply to all embodiments and examples described herein and will not be repeated for the sake of brevity. The selectivity of etch process 101 (exposed silicon nitride:exposed silicon) is greater than 75:1, greater than 100:1 or greater than 125:1 in embodiments. No measurable amount of silicon was etched using silicon nitride selective etch process 101 according to embodiments. The exposed portion of silicon has an exposed surface having no native oxide or silicon oxide on the exposed surface in embodiments.

Water vapor was used as an example of a second precursor in FIG. 1 and the associated discussion. Generally speaking, the second precursor may comprise or consist of hydrogen and oxygen. The second precursor may comprise an —OH chemical group according to embodiments, which includes water vapor and alcohols. The second precursor may comprise or consist of carbon, hydrogen and oxygen. For example, the second precursor may include $CH_3OH$ or $C_2H_5OH$ or $C_3H_7OH$ in embodiments. Examples which do not contain hydrogen or fluorine have also been helpful. The second precursor may comprise or consist of silicon and fluorine. The second precursor may include $Si_xF_y$ (for example, $SiF_4$ or $Si_2F_6$). Generally speaking, including a hydrogen-and-oxygen-containing precursor as the second precursor has improved the etch rate of silicon nitride (though selectivity also improved somewhat). Including a silicon-and-fluorine-containing precursor for the second precursor improved the selectivity without much change to the etch rate of the silicon nitride.

The anhydrous hydrogen fluoride and/or the secondary precursor may further include one or more relatively inert gases (e.g. He, $N_2$, Ar). Flow rates and ratios of the different gases may be used to control etch rates and etch selectivity. In an embodiment, the anhydrous hydrogen fluoride may be flowed into the substrate processing region at a flow rate of between about 10 sccm (standard cubic centimeters per minute) and 1,000 sccm in embodiments. The second precursor may be flowed into the substrate processing region at a flow rate of between 10 sccm and 5 slm (standard liters per minute) or between 10 mg/m (milligrams per minute) and 5 g/m (grams per minute) in embodiments as appropriate. Argon (Ar) and/or Helium (He) may be flowed along with either (or both, separately) precursor at a flow rate of between 0 sccm and 3,000 sccm. One of ordinary skill in the art would recognize that other gases and/or flows may be used depending on a number of factors including processing chamber configuration, substrate size, geometry and layout of features being etched. These process parameters apply to all examples described herein. Additional process parameters will be given following the example of FIG. 2.

Figure 2:
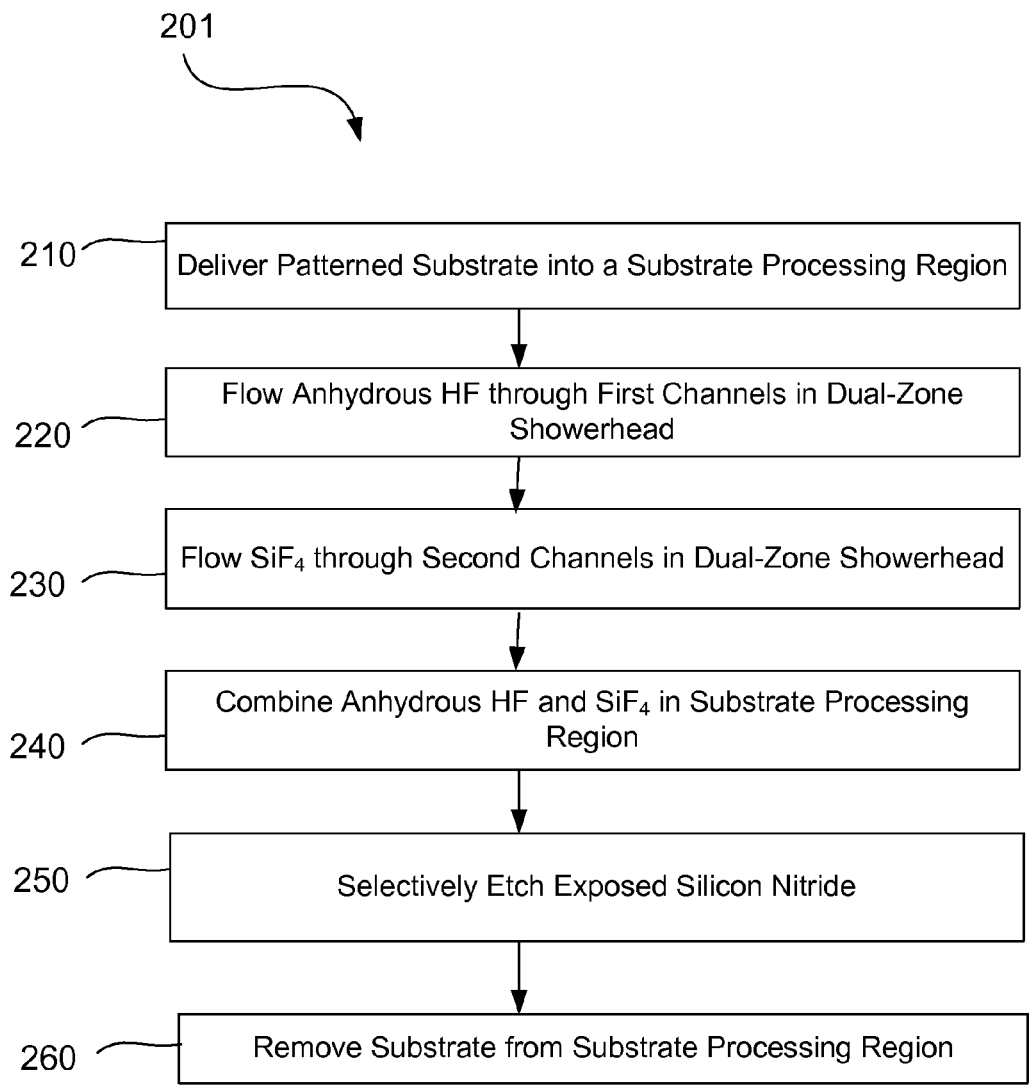
FIG. 2 shows a method of selectively etching silicon nitride according to embodiments.

Reference is now made to FIG. 2 which is a flow chart of a silicon nitride selective etch process 201 according to embodiments. Prior to the first operation, a structure is formed in a patterned substrate. The structure possesses exposed portions of silicon nitride and silicon (e.g. single crystal silicon or polysilicon). The patterned substrate is then delivered into a substrate processing region in operation 210.

A flow of gas-phase HF (e.g. anhydrous HF) is initiated into the substrate processing region through a first channel of a dual-channel showerhead in operation 220. $SiF_4$ is flowed into the substrate processing region through a second channel of a dual-channel showerhead in operation 230. The first channel and the second channel are separate pathways, in embodiments, and the only path from the second channel to the first channel (or vice versa) is through the substrate processing region. The first channel may comprise through-holes in the dual-channel showerhead and the second channel may comprise blind-holes which open into the substrate processing region but not directly into the region above the dual channel showerhead. The roles may also be reversed, namely, the second channel may comprise through-holes in the dual-channel showerhead and the first channel may comprise blind-holes in embodiments. The gas-phase HF is combined with $SiF_4$ in the substrate processing region in operation 240. Neither the $SiF_4$ nor the gas-phase HF are passed through any remote plasma before entering the substrate processing region according to embodiments.

The patterned substrate is selectively etched (operation 250) such that the exposed silicon nitride is selectively removed at a higher rate than the exposed second portion. The substrate processing region may be plasma-free during all operations of selective silicon nitride etch process 201 or during operations 240 and 250 in embodiments. The exposed second portion may comprise or consist of silicon in embodiments. The exposed second portion may comprise or consist of silicon and oxygen according to embodiments. The addition of $SiF_4$ (or a second precursor as generalized later) is optional and may be used to increase the etch selectivity of silicon nitride relative to the exposed second portion and/or to increase the etch rate of silicon nitride. Process effluents and unreacted reactants are removed from the substrate processing region and then the substrate is removed from the processing region (operation 260).

During the operation of selectively etching exposed silicon nitride, the pressure in the substrate processing region may be greater than 5 Torr, greater than 10 Torr, greater than 15 Torr or greater than 25 Torr according to embodiments. The pressure in the substrate processing region may be less than 1,000 Torr, less than 750 Torr, less than 500 Torr, less than 250 Torr, or less than 100 Torr in embodiments. Upper bounds of all parameters may be combined with lower bounds of the same parameters to form additional embodiments. In a preferred embodiment, the pressure in the substrate processing region during the operation of selectively etching exposed silicon nitride is between 20 Torr and 110 Torr.

During the operation of selectively etching exposed silicon nitride, The temperature of the patterned substrate may be between 40° C. and 200° C. or between 50° C. and 150° C. in embodiments. Prior art processes involving anhydrous hydrogen fluoride have etched silicon oxide faster than silicon nitride by keeping the substrate temperature lower than the ranges provided herein. The etch selectivity of silicon nitride relative to silicon oxide may be in the highest range for patterned substrate temperatures between 55° C. and 75° C. The patterned substrate temperature may be between 55° C. and 75° C. in embodiments.

In all processes described herein the remote region may be devoid of nitrogen, during the operation of selectively etching exposed silicon nitride. For example, the substrate processing region may be devoid of ammonia (or NxHy in general) during the silicon nitride etch. A source of ammonia is often added to prior art processes involving anhydrous hydrogen fluoride to enhance the etch rate of silicon oxide, which is undesirable in embodiments described herein. Such a reaction reduces the selectivity of the exposed silicon nitride portions as compared with exposed silicon oxide portions.

The substrate processing region may be described herein as "plasma-free" during the etch processes described herein. Maintaining a plasma-free substrate processing region and employing the precursors described herein enable the achievement of high etch rate selectivity of silicon nitride relative to silicon and silicon oxide. Alternatively, the electron temperature may be less than 0.5 eV, less than 0.45 eV, less than 0.4 eV, or less than 0.35 eV within the substrate processing region during any or all operations described herein according to embodiments. A benefit of the processes described herein include a reduction in plasma damage by using predominantly neutral species to perform the selective silicon nitride etch processes. Conventional plasma etch processes may include sputtering and bombardment components. Another benefit of the processes described herein include a reduction in stress on delicate features on a patterned substrate compared to conventional wet etch processes which can cause bending and peeling of small features as a result of surface tension of liquid etchants.

Figure 3A:
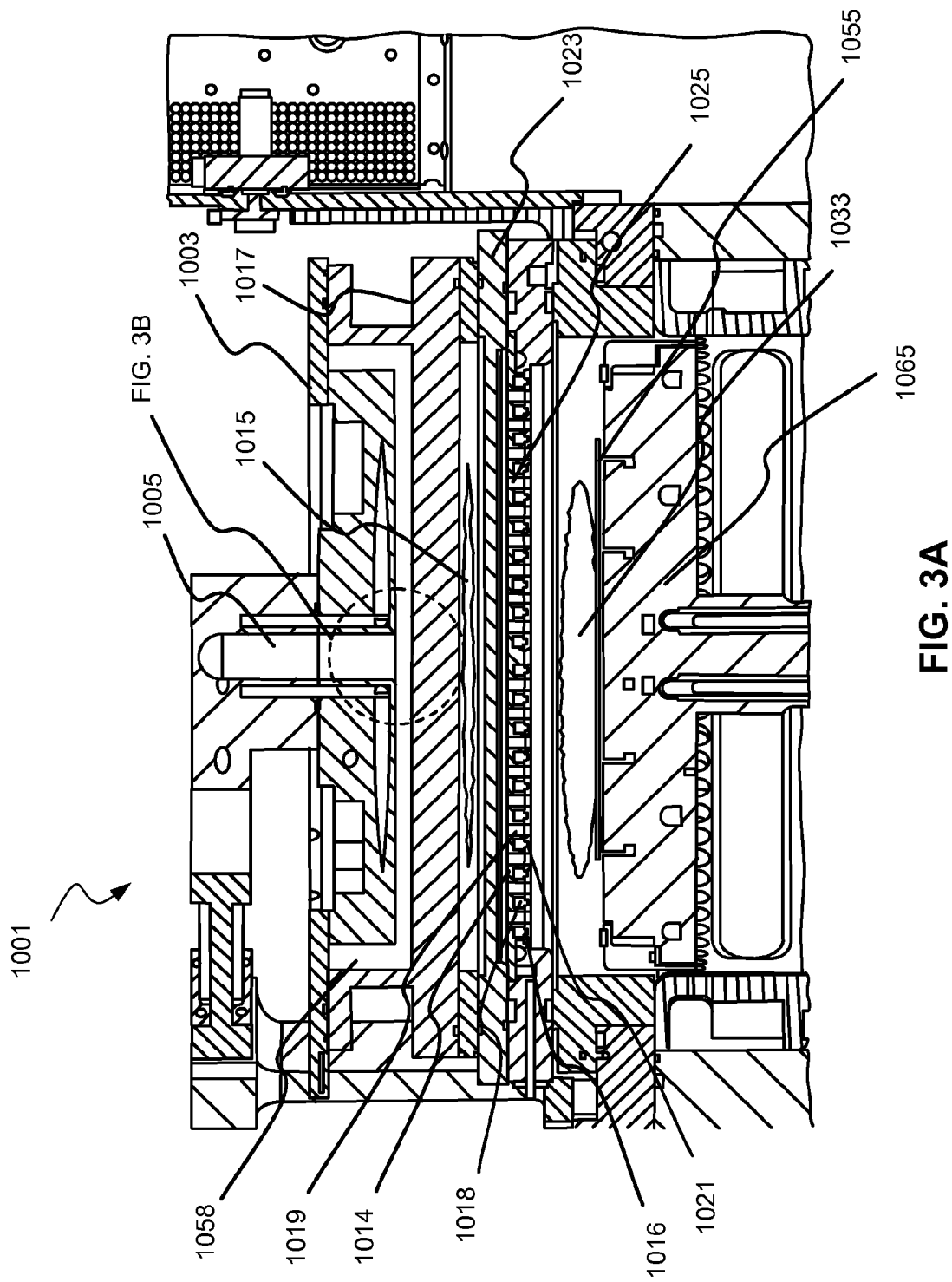
FIG. 3A shows a schematic cross-sectional view of a substrate processing chamber according to embodiments.

Exemplary hardware will now be described. FIG. 3A shows a cross-sectional view of an exemplary substrate processing chamber 1001 with a partitioned region within the processing chamber. During film etching, a process gas may be flowed through gas inlet assembly 1005 and into remote region 1015. A cooling plate 1003, faceplate 1017, ion suppressor 1023, showerhead 1025, and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −40° C. to 200° C. Pedestal 1065 may also be resistively heated to relatively high temperatures, such as between 100° C. and 1100° C., using an embedded heater element.

Exemplary configurations may include having the gas inlet assembly 1005 open into a gas supply region 1058 partitioned from the remote region 1015 by faceplate 1017 so that the gases/species flow through the holes in the faceplate 1017 into the remote region 1015. A precursor, for example anhydrous HF, may be flowed into substrate processing region 1033 by embodiments of the showerhead described herein. Excited species derived from the process gas in remote region 1015 may travel through apertures in showerhead 1025 and react with a secondary precursor flowing into substrate processing region 1033 from a separate portion of the showerhead, which may therefore be called a dual-channel showerhead.

Figure 3B:
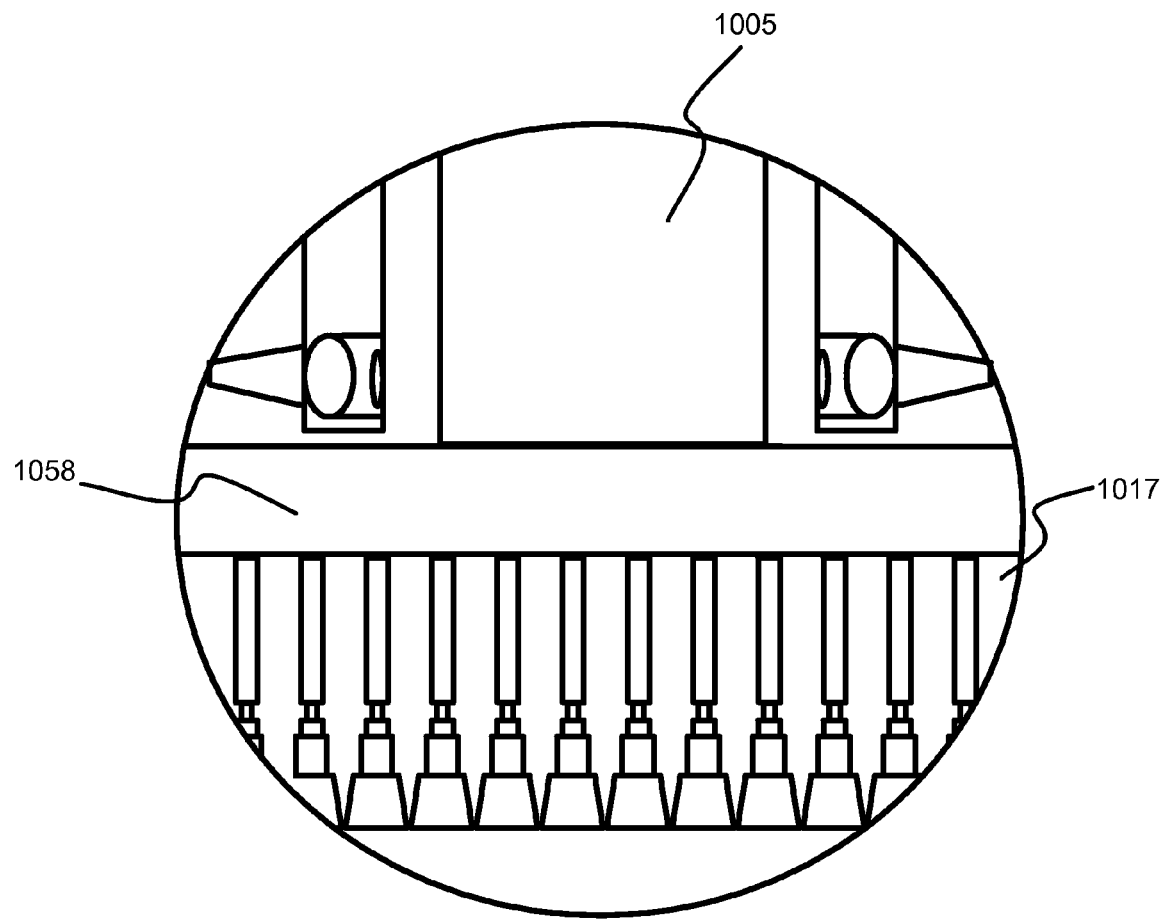
FIG. 3B shows a schematic cross-sectional view of a portion of a substrate processing chamber according to embodiments.

FIG. 3B shows a detailed view of the features affecting the processing gas distribution through faceplate 1017. The gas distribution assemblies such as showerhead 1025 for use in the processing chamber section 1001 may be referred to as dual-channel showerheads (DCSH) and are additionally detailed in the embodiments described in FIG. 3A as well as FIG. 3C herein. The dual channel showerhead may provide for etching processes that allow for separation of etchants outside of the substrate processing region 1033 to provide limited interaction with chamber components and each other prior to being delivered into substrate processing region 1033.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead described.

A process gas may flow into remote region 1015 and then through first fluid channels 1019 of showerhead 1025. The process gas may include HF. A plasma may not be generated and may not be present in substrate processing region 1033 during any or all operations presented herein. A plasma may not be generated and may not be present in remote region 1015 during any or all operations presented herein. The two regions may be referred to as plasma-free substrate processing region 1033 and plasma-free remote region 1015. The process gas may also include a carrier gas such as helium, argon, nitrogen ($N_2$), etc. The showerhead may be referred to as a dual-channel showerhead as a result of the two distinct pathways into the substrate processing region. The anhydrous hydrogen fluoride may be flowed through the through-holes in the dual-channel showerhead and the secondary precursor may pass through separate channels in the dual-channel showerhead. The separate channels may open into the substrate processing region but not into the remote region as described above. Combined flow rates of precursors into the substrate processing region may account for 0.05% to about 20% by volume of the overall gas mixture; the remainder being carrier gases.

Figure 3C:
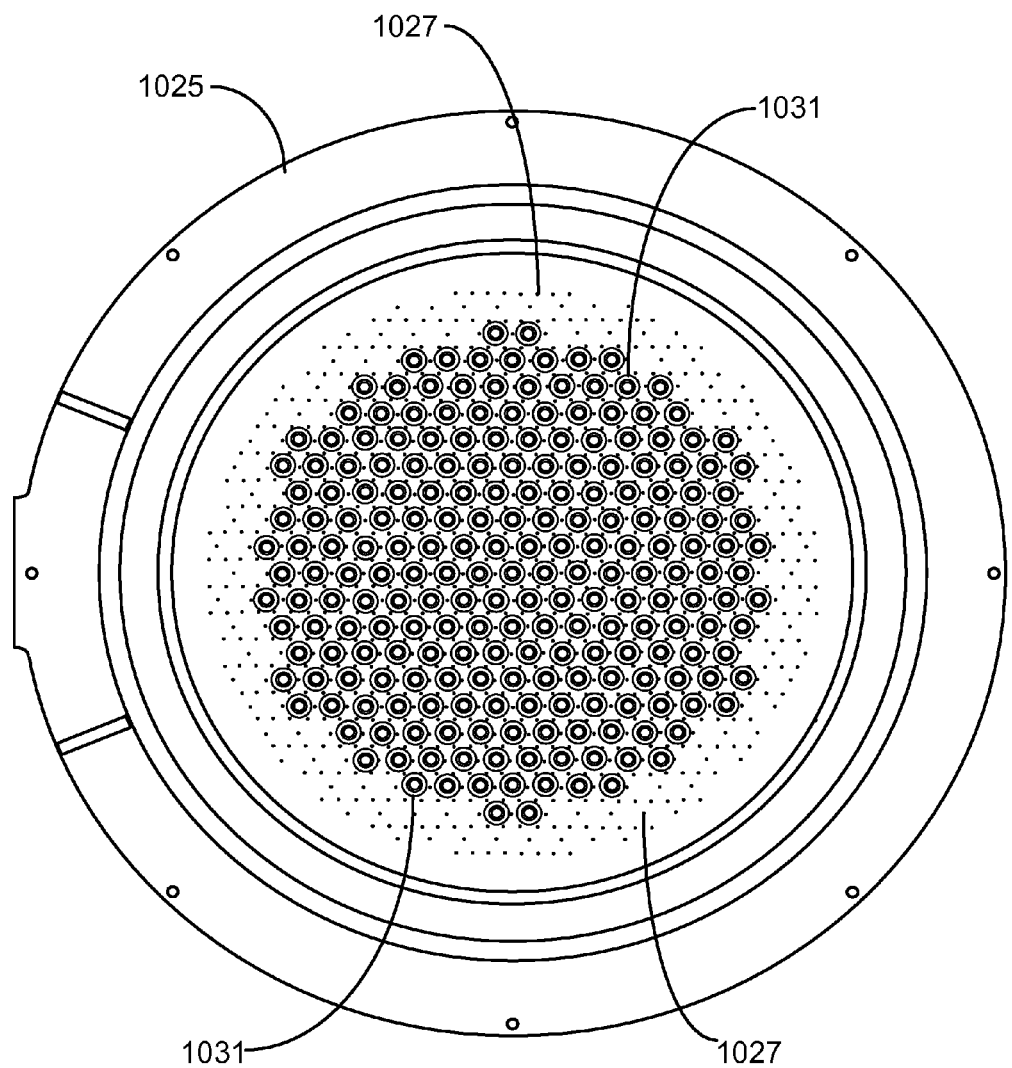
FIG. 3C shows a bottom view of a showerhead according to embodiments.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

Figure 4:
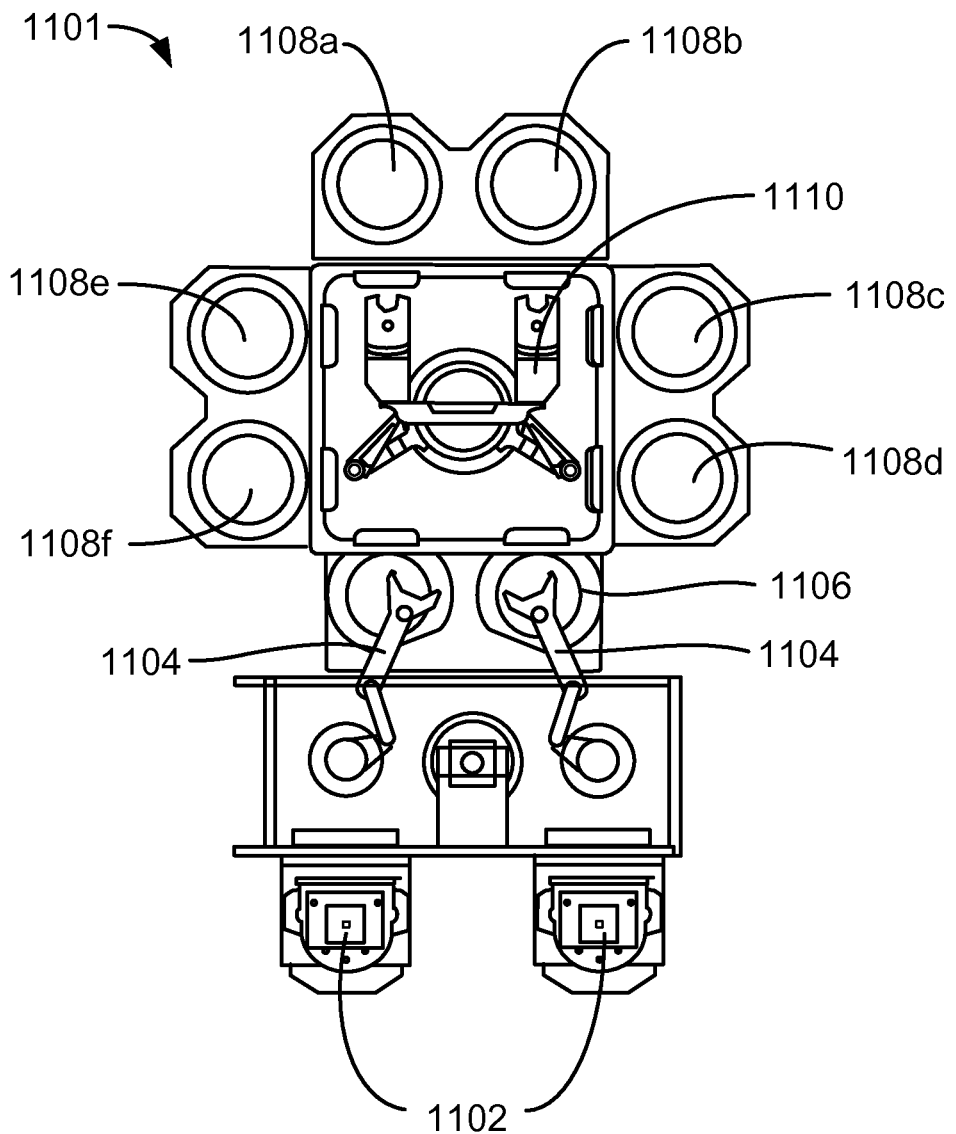
FIG. 4 shows a top view of an exemplary substrate processing system according to embodiments.

Embodiments of the dry etch systems may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly silicon but may include concentrations of other elemental constituents such as, e.g., nitrogen, oxygen, hydrogen and carbon. In some embodiments, silicon portions etched using the methods described herein consist essentially of silicon. Exposed "silicon oxide" of the patterned substrate is predominantly $SiO_2$ but may include concentrations of other elemental constituents such as, e.g., nitrogen, hydrogen and carbon. In some embodiments, silicon oxide portions described herein consist essentially of silicon and oxygen. Exposed "silicon nitride" of the patterned substrate is predominantly $Si_3N_4$ but may include concentrations of other elemental constituents such as, e.g., oxygen, hydrogen and carbon. In some embodiments, silicon nitride portions described herein consist essentially of silicon and nitrogen.

The term "gap" is used throughout with no implication that the etched geometry has a large horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

The term "precursor" is used to refer to any process gas which takes part in a reaction to either remove material from or deposit material onto a surface. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of etching a patterned substrate, the method comprising:
    placing the patterned substrate in a substrate processing region of a substrate processing chamber, wherein the patterned substrate has an exposed silicon nitride portion and an exposed silicon portion;
    flowing anhydrous hydrogen fluoride into a remote region fluidly coupled to the substrate processing region through a dual-channel showerhead, wherein the anhydrous HF flows from the remote region to the substrate processing region through a first channel comprising through-holes through the dual-channel showerhead;
    flowing a hydrogen-and-oxygen-containing precursor into the substrate processing region through a second channel comprising holes which open into the substrate processing region but not directly into the remote region;
    combining the HF vapor with the hydrogen-and-oxygen-containing precursor in the substrate processing region; and
    dry etching the exposed silicon nitride portion, wherein the silicon nitride is removed at a silicon nitride etch rate which is greater than a secondary etch rate at which the exposed silicon portion is removed.

2. The method of claim 1 wherein the hydrogen-and-oxygen-containing precursor consists of hydrogen-and-oxygen.

3. The method of claim 1 wherein a selectivity of the dry etching (exposed silicon nitride:exposed silicon) is greater than or about 75:1.

4. The method of claim 1 wherein the exposed silicon portion is one of single-crystal silicon, polysilicon or amorphous silicon.

5. The method of claim 1 wherein the hydrogen-and-oxygen-containing precursor and the anhydrous hydrogen fluoride first mix within the substrate processing region.

6. The method of claim 1 wherein the substrate processing region is plasma-free during the dry-etching.

7. The method of claim 1 wherein the anhydrous hydrogen fluoride is not excited in any plasma prior to entering the substrate processing region.

8. The method of claim 1 further comprising flowing a silicon-and-fluorine-containing precursor into the substrate processing region, wherein the silicon-and-fluorine-containing precursor and the anhydrous hydrogen fluoride first mix within the substrate processing region.

9. A method of etching a patterned substrate, the method comprising:
- placing the patterned substrate in a substrate processing region of a substrate processing chamber, wherein the patterned substrate has exposed silicon nitride and exposed silicon;
- flowing HF vapor into a remote region fluidly coupled to the substrate processing region through a dual-channel showerhead, wherein the HF vapor flows from the remote region to the substrate processing region through a first channel comprising through-holes through the dual-channel showerhead;
- flowing a carbon-hydrogen-and-oxygen-containing precursor into the substrate processing region through a second channel comprising holes which open into the substrate processing region but not directly into the remote region;
- combining the HF vapor with the carbon-hydrogen-and-oxygen-containing precursor in the substrate processing region; and
- etching the exposed silicon nitride more rapidly than the exposed silicon.

10. The method of claim 9 wherein a selectivity of the operation (exposed silicon nitride:exposed silicon) is greater than or about 75:1.

11. The method of claim 9 wherein neither the HF vapor nor the carbon-hydrogen-and-oxygen-containing precursor flow through any plasma prior to entering the substrate processing region.

12. The method of claim 9 wherein the carbon-hydrogen-and-oxygen-containing precursor consists of carbon, hydrogen and oxygen.

13. The method of claim 9 wherein a temperature of the patterned substrate is between 40° C. and about 160° C. while etching the exposed silicon nitride.

14. A method of etching a patterned substrate, the method comprising:
- placing the patterned substrate in a substrate processing region of a substrate processing chamber, wherein the patterned substrate has an exposed silicon nitride portion and an exposed portion of silicon;
- flowing anhydrous HF into a remote region fluidly coupled to the substrate processing region through a dual-channel showerhead, wherein the anhydrous HF flows from the remote region to the substrate processing region through a first channel comprising through-holes through the dual-channel showerhead;
- flowing $Si_XF_Y$ into the substrate processing region without first passing the $Si_XF_Y$ through a plasma and without first passim the $Si_XF_Y$ through the remote region;
- combining the anhydrous HF and the $Si_XF_Y$ in the substrate processing region, and
- etching the exposed silicon nitride portion, wherein a temperature of the patterned substrate is between 50° C. and 80° C.

15. The method of claim 14 wherein the $Si_XF_Y$ is $SiF_4$.

16. The method of claim 14 wherein a selectivity of the etching (exposed silicon nitride:exposed silicon) is greater than or about 75:1.

* * * * *

UNITED STATES PATENT AND TRADEMARK OFFICE
CERTIFICATE OF CORRECTION

PATENT NO. : 9,576,815 B2
APPLICATION NO. : 14/690165
DATED : February 21, 2017
INVENTOR(S) : Jingjing Xu et al.

It is certified that error appears in the above-identified patent and that said Letters Patent is hereby corrected as shown below:

In the Claims

In Column 12, Line 21, Claim 14: after "first" please delete "passim" and insert --passing--

Signed and Sealed this
Eleventh Day of April, 2017

Michelle K. Lee
*Director of the United States Patent and Trademark Office*